United States Patent
Wong et al.

(10) Patent No.: US 6,857,434 B2
(45) Date of Patent: Feb. 22, 2005

(54) CMP SLURRY ADDITIVE FOR FOREIGN MATTER DETECTION

(75) Inventors: Kwong Hon Wong, Wappingers Falls, NY (US); Karl E. Boggs, Hopewell Junction, NY (US); Raphael Mitchell, Pine Bush, NY (US); Uldis A. Ziemins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 10/056,387

(22) Filed: Jan. 24, 2002

(65) Prior Publication Data

US 2003/0139048 A1 Jul. 24, 2003

(51) Int. Cl.[7] .................................................. C25F 5/00
(52) U.S. Cl. ........................................ 134/1.3; 438/693
(58) Field of Search ................................ 438/690–693; 134/1.1–1.3

(56) References Cited

U.S. PATENT DOCUMENTS

| | | | | |
|---|---|---|---|---|
| 3,443,092 A | | 5/1969 | Carr-Brion et al. | |
| 5,320,706 A | * | 6/1994 | Blackwell | 438/693 |
| 5,483,568 A | * | 1/1996 | Yano et al. | 438/16 |
| 5,679,169 A | * | 10/1997 | Gonzales et al. | 134/1.3 |
| 5,704,987 A | | 1/1998 | Huynh et al. | |
| 5,807,605 A | | 9/1998 | Tingey et al. | |
| 5,922,606 A | * | 7/1999 | Jenkins et al. | 436/55 |
| 6,375,791 B1 | * | 4/2002 | Chiesl et al. | 156/345.13 |
| 6,569,690 B1 | * | 5/2003 | Houge et al. | 438/8 |

OTHER PUBLICATIONS

Burke, P., et al., "Evaluation of Contaminant-Induced Charge from Oxide Chemical-Mechanical Polish", Proceedings of the SPIE—The International Society for Optical Engineering Conference, Title: Proc. SPIE—Int. Soc. Opt. Eng. (USA), vol. 2638, p. 27–37, 1995.

* cited by examiner

Primary Examiner—Duy-Vu N. Deo
(74) Attorney, Agent, or Firm—McGinn & Gibb, PLLC; Jay H. Anderson, Esq.

(57) ABSTRACT

A method and structure polishes and cleans silicon wafers by mixing a marker with a slurry to form a slurry mixture, performs chemical mechanical polishing on a silicon wafer using the slurry mixture, rinses the slurry mixture from the silicon wafer, checks the silicon wafer for marker residue, and repeats the rinsing process if the checking process detects the marker residue on the wafer.

8 Claims, 1 Drawing Sheet

CM P SLURRY ADDITIVE FOR FOREIGN MATTER DETECTION

BACKGROUND OF THE INVENTION

1. Field of the Invention

The present invention generally relates to chemical mechanical polishing (CMP) processes and more particularly to an improved process that utilizes a marker with the slurry mixture that more clearly indicates whether the slurry has been completely rinsed from the silicon wafer after the CMP process has been completed.

2. Description of the Related Art

In the manufacture of integrated circuits, semiconductor wafer surface planarity is of extreme importance. To achieve the degree of planarity required to produce ultra high density integrated circuits, chemical-mechanical polishing/planarization (CMP) is often employed. The terms "planarization" and "polishing" as used herein are interchangeable when referring to the technique of "CMP." In general, CMP involves holding a semiconductor wafer against a moving polishing surface that is wetted with a chemically reactive, abrasive material or slurry, such as silica or alumina. For example, the slurry typically comprises a colloidal suspension of silica particles in a KOH-based solution. The polishing surface is generally a planar pad made of relatively soft, porous material such as blown polyurethane and is usually mounted on a planar platen.

One of the major disadvantages of CMP is the higher defect level observed on post-CMP cleaned wafers. These defects on the semiconductor wafer typically correspond to submicron oxide (e.g., $SiO_2$ or $Al_2O_3$) particles from the polishing slurry that remain on the wafer surface after polishing. After CMP, a water rinse and brush scrub are typically employed to remove slurry residue from the surface of the semiconductor wafer. A primary concern with the use of CMP is the efficient and complete removal of the polishing slurry to prevent problems in subsequent processing steps. Commonly used CMP slurries use inorganic oxides such as alumina and silica. If the post-polish cleaning is not sufficient, a layer of the slurry residue will loosely adhere to the product wafer. Slurry residue often becomes detached from wafers during subsequent processing, causing severe foreign matter (FM) problems and defects. Unlike photoresist, the slurry oxides are non-volatile and cannot be detected by a residual gas analyzer (RGA). For example, if the slurry is buried inside metal during sputtering, it will create an electrical short defect after subsequent patterning by reactive ion etching (RIE). Another conventional problem is that the slurry oxides remain on the bevel edges of wafers and are not easily detected by conventional FM inspection tools. Therefore, there is a need for an improved system of detecting the remaining slurry after the wafers have been cleaned. The invention discussed below provides such a system that avoids the above-mentioned problems.

SUMMARY OF THE INVENTION

In view of the foregoing and other problems, disadvantages, and drawbacks of the conventional CMP processes, the present invention has been devised, and it is an object of the present invention, to provide a system for CMP slurry detection.

In order to attain the object(s) suggested above, there is provided, according to one aspect of the invention, a process for polishing and cleaning silicon wafers. The invention first mixes a marker with a slurry to form a slurry mixture. Next, the invention performs chemical mechanical polishing on a silicon wafer using the slurry mixture. The invention rinses the slurry mixture from the silicon wafer and checks the silicon wafer for marker residue. The invention then repeats the rinsing process if the checking process detects marker residue on the wafer.

The checking process illuminates the silicon wafer with a light source and detects a spectrum of light reflected from the silicon wafer. The checking process illuminates light to, and detects light from, edges of the silicon wafer. The light source includes at least one light emitting diode. The marker fluorescence or phosphorescence has a characteristic spectrum upon excitation by the incident illumination of the light source. The marker is mixed with the slurry in small enough quantities so as to not affect a polishing capability of the slurry. The checking process can also be based on residual gas analysis and includes a marker which has a higher vapor pressure than the slurry.

The invention further includes a system that performs chemical mechanical polishing and cleaning of a wafer. The invention includes a slurry mixer adapted to dispense a slurry mixture, wherein the slurry mixture includes a marker, a rotating platen adapted to contact and polish the wafer which uses the slurry mixture. The invention also includes a rinse dispenser positioned adjacent the wafer which rinses the slurry mixture from the wafer. The invention further includes a detector positioned adjacent the wafer which detects marker residue.

The slurry supply is connected to the slurry mixer and supplies slurry to the slurry mixer. The marker supply is connected to the slurry mixer and supplies the marker to the slurry mixer. The light source is positioned adjacent the wafer and illuminates the wafer. The detector can be a light detector for detecting a spectrum of light reflected from the silicon wafer. The light source is preferably positioned to illuminate edges of the wafer and the detector is positioned to detect light reflections from the edges of the wafer. The marker has a phosphorescence/fluorescence upon illumination by the light source. The detector can be a residual gas analyzer and the marker has a higher vapor pressure than the slurry.

The invention prevents contaminating subsequent processing tools (e.g., metal sputtering, RIE, etc.), which would otherwise lead to defects. Without the invention, the tool has to shutdown for cleanup and kit change. This is very time consuming and expensive for vacuum processing tools such as a metal sputtering tool. Cross-contamination of wafers within the same lot leads to process defects and low product yield. An alternative implementation of the invention uses a slurry with a premixed marker (i.e., not in-situ mixing). Also, the detection scheme can be implemented in an standalone enclosure with light source and detectors and does not needed to be fully integrated into an existing CMP system; or a standard vacuum chamber with RGA detectors.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED
Embodiments of the Invention

In order to overcome the conventional problems of detecting slurry residue on silicon wafers that are discussed above, the invention adds a marker to the slurry. The marker is added in a very small quantity so that it will not affect the polishing characteristic of the regular slurry. An example of an acceptable percentage range that the marker would make up of the slurry mixture is fluorescence or phosphorescence dye in the 1 to 100 ppm range and volatile organics additives in the 10 to 500 ppm range.

Figure 1:
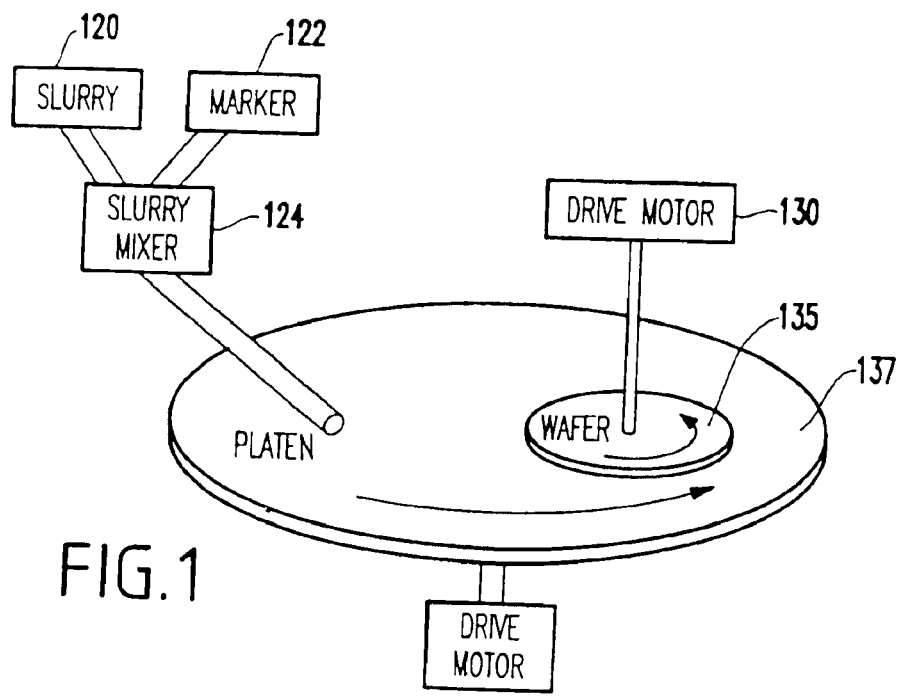
FIG. 1 is a schematic diagram of a chemical mechanical polishing system according to the invention.

For example, as shown in FIG. 1, the invention includes a marker container 122 from which marker material is mixed with slurry from a slurry container 120 in a slurry mixture container 124. The slurry mixture container 124 supplies the slurry mixture to the platen 137 which is rotated by a drive motor 130. The silicon wafer 135 is also rotated by drive motor 130 and moves around the rotating platen 137. This action polishes the side of the wafer 135 that is in contact with the platen 137.

Figure 2:
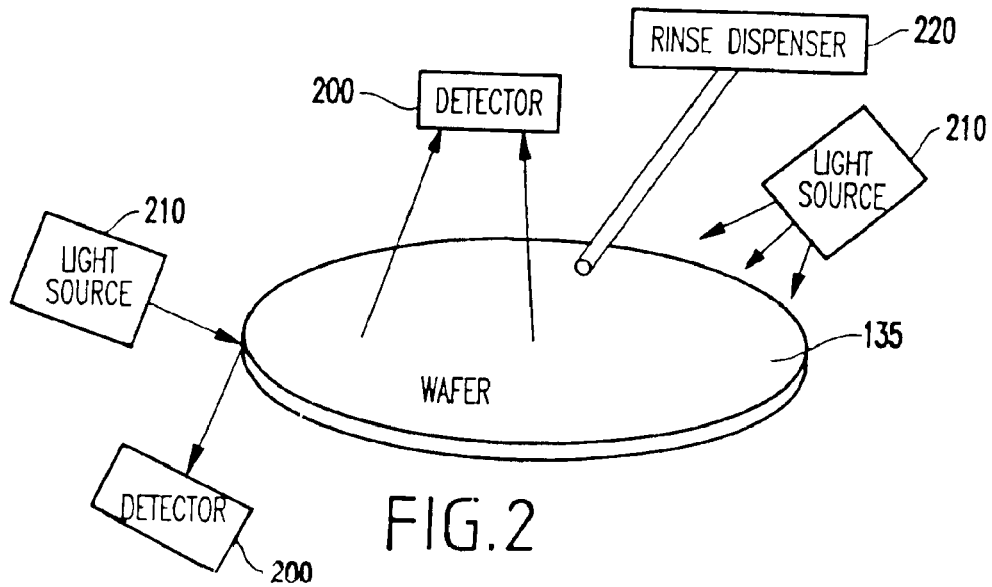
FIG. 2 is a schematic diagram of a detector used to determine whether additional slurry remains upon the silicon wafer according to the invention.

As shown in FIG. 2, the wafer 135 is rinsed and cleaned by a rinse dispenser/brush 220 and is inspected by detectors 200. The detectors 200 could be RGA or light spectrum detectors that detect reflected light from light sources 210. The light sources 210 can be a single light source or many light sources and can be used to detect the flat top portion or the edge of the wafer 135, as shown in FIG. 2. The wafer can be mounted on a rotor so that the entire area and perimeter of the wafer can be checked.

The marker can be any substance that is easily detected yet which does not impair the polishing ability of the slurry. For example, a good marker is fluorescent dye which can be picked up by any standard fluorescence technique. With fluorescent dyes, the invention uses laser LED light sources 210 to shine light on the wafer and light spectrum detectors 210 to measure the spectrum of the light reflected (bounced back).

Another useful marker is a compound with sufficiently high vapor pressure that can be easily detected by an RGA which is commonly installed in many degas chamber metal sputtering tools. For example, one useful marker has a hydrocarbon group which is easily detected by an RGA. Conventional attempts to detect the current slurry mixture using RGA were unsuccessful due to the low vapor pressures of the slurry residue. Unlike the extreme low vapor pressures of the main ingredients in slurry (aluminum oxide or silicon), the hydrocarbon group has a higher vapor pressure and is easily detected by an RGA. Thus, RGA detection is not a viable option with conventional slurry constituents but is useful with the invention. The marker is preferably pH balanced so as to not disturb the CMP process. RGA tracer materials need to be low molecular weight organic compounds that are either inert or beneficial to the polishing process and are at least slightly soluble in the slurry composition. Materials that would specifically adsorb to the slurry abrasives (silica, alumina, ceria, etc.) are ideal. Some of these materials include amino acids: glycine, alanine, serine, cysteine, aspartic acid, lysine; organic acids: formic acid, acetic acid, propionic acid, oxalic acid, malonic acid, benzoic acid, malic acid; alcohols: butanol, pentanol, hexanol, phenol, ethylene glycol, propylene glycol; and short chain surfactants: stearic acid, sodium octanoate detergents formed from sulfation and sulfonation of short chain alcohols (e.g. septyl sulfate, n-decyl sulfonate). Also, thiols, esters, aldehydes, and amines (as long as they are low MW, somewhat soluble in water and do not degrade polish) are very useful. Glycine, serine, lysine, hexanol, and the glycols are similarly useful with the invention. Amino acids and the glycols help with certain polishing applications and are least offensive as far as detectable odor of slurry and chemical attack of silicon substrates.

Flourescent dyes must also be at least slightly soluble in the slurry, and having specific adsorption to the abrasive phase is helpful. Alcohol soluble chemicals can be added to a prepared slurry to "tag" the abrasives with dye. Laser dyes are very useful in this application because due to their high intensity fluorescence. These include: coumarin series, fluorescein, rhodamine series, stilbene series, eosin RDC series, cresyl violet QUI, PBBO, DPS, BiBuQ Butyl-PBD, DCM, DMQ, and quite a few others. Rhodamine and fluorescein are useful due to cost considerations. The fluorescence spectrum depends upon specific dyes but is usually near UV to the visible light region. As mentioned above, specific adsorption of the materials to the slurry particles is advantageous. For many of the materials listed, the electrolyte concentration of the slurry will also drive the specific adsorption by reducing the solubility in the slurry.

Figure 3:
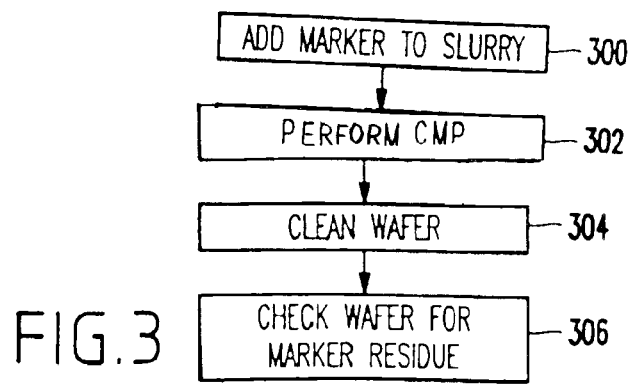
FIG. 3 is a flow diagram illustrating a preferred method of the invention.

FIG. 3 illustrates the processing of the invention in flowchart form. More specifically, in item 300, the marker is added to the slurry. Then, in item 302, the conventional CMP is performed. Next, the wafer is cleaned (item 304). Finally, the wafer is checked for marker residue and recleaned if necessary, as shown in item 306.

The invention detects any slurry residue on the wafers and is particularly effective in detecting slurry residue on the bevel edges of the wafer. This is especially important because manual beveled edge inspections for FM are very time-consuming and have the potential to miss the FM. With the invention, wafers are sent back to be recleaned if residue is detected. By recleaning, the invention minimizes the defect rate. Also, the invention prevents contamination of subsequent processing tools (such as the metal tools) by ensuring that the slurry residue is removed. Another important feature of the invention is the detection of slurry residue on the edges, which would otherwise detach and be carried back onto the top surface of the wafer during subsequent processing, or be dislodged into the subsequent processing tool chamber.

With the invention, foreign matter is identified before post-CMP processing. Thus, with the invention, it is necessary only to reclean the wafer, as opposed to scrapping a wafer that has slurry residue contaminated post-CMP structures. The invention is used to check wafers regardless of the patterns or the levels.

The invention prevents contaminating subsequent processing tools (e.g., metal sputtering, RIE, etc.), which would otherwise lead to defects. Without the invention, the tool has to shutdown for cleanup and kit change. This is very time consuming and expensive for vacuum processing tools such as a metal sputtering tool. Cross-contamination of wafers within the same lot leads to process defects and low product yield. An alternative implementation of the invention uses a slurry with a premixed marker (i.e., not in-situ mixing). Also, the detection scheme can be implemented in an standalone enclosure with light source and detectors and does not need to be fully integrated into an existing CMP system, or a standard vacuum chamber with RGA detectors.

While the invention has been described in terms of preferred embodiments, those skilled in the art will recognize that the invention can be practiced with modification within the spirit and scope of the appended claims.

What is claimed is:

1. A process for polishing wafers comprising:
   mixing a marker with a slurry to form a slurry mixture;
   performing chemical mechanical polishing on a wafer using said slurry mixture;
   rinsing said slurry mixture from said wafer; and checking said wafer for marker residue,
   wherein said checking comprises residual gas analysis and said marker has a higher vapor pressure than said slurry.

2. A process for polishing and cleaning silicon wafers comprising:
   mixing a marker with a slurry to form a slurry mixture, wherein said marker has a higher vapor pressure than said slurry;
   performing chemical mechanical polishing on a silicon wafer using said slurry mixture; rinsing said slurry mixture from said silicon wafer; and
   checking said silicon wafer for marker residue.

3. The process in claim 2, wherein said checking comprises illuminating said silicon wafer with a light source and detecting a spectrum of light returned from said silicon wafer.

4. The process in claim 3, wherein said checking illuminates light to, and detects light from, edges of said silicon wafer.

5. The process in claim 3, wherein said light source comprises one of a light emitting diode and a laser.

6. The process in claim 3, wherein said marker has a characteristic phosphorescence upon illumination by said light source.

7. The process in claim 2, wherein said marker is mixed with said slurry in small enough quantities so as to not affect a polishing capability of said slurry.

8. A process for polishing and cleaning silicon wafer comprising:
   mixing a marker with a slurry to form a slurry mixture;
   performing chemical mechanical polishing on a silicon wafer using said slurry mixture;
   rinsing said slurry mixture from said silicon wafer;
   checking said silicon wafer for marker residue; and
   repeating said rinsing process if said checking process detects said marker residue on said wafer,
   wherein said checking comprises reactive gas analysis and said marker has a higher vapor pressure than said slurry.

* * * * *